United States Patent [19]
Laureanti et al.

[11] Patent Number: 6,093,888
[45] Date of Patent: Jul. 25, 2000

[54] APPARATUS, AND ASSOCIATED METHOD, FOR SHIELDING EMI-GENERATIVE COMPONENTS OF AN ELECTRICAL DEVICE

[75] Inventors: Steven J. Laureanti, Lewisville; Russ Michaud, Justin; Jukka-Pekka Neitiniemi; Kari Saukko, both of Irving, all of Tex.

[73] Assignee: Nokia Networks Oy, Espoo, Finland

[21] Appl. No.: 09/250,793

[22] Filed: Feb. 17, 1999

[51] Int. Cl.⁷ ..................................................... H05K 9/00
[52] U.S. Cl. ........................ 174/35 R; 361/816; 361/803; 361/800; 257/659; 257/725; 174/60
[58] Field of Search ........................... 174/35 R, 35 MS, 174/55.2, 52.3, 52.4, 49, 60, 64, 65 R; 361/816, 818, 800, 803; 333/247; 455/117, 300; 257/659, 660, 723, 724, 725

[56] References Cited

U.S. PATENT DOCUMENTS 3,862,350  1/1975  Milosavich ........................... 174/35 R
4,685,034  8/1987  Tetsu et al. ............................ 361/818

*Primary Examiner*—Dean A. Reichard
*Assistant Examiner*—Hung V Ngo
*Attorney, Agent, or Firm*—Robert H. Kelly; Holland & Hart LLP

[57] ABSTRACT

Apparatus, and an associated method, shields separate component portions of an electronic device housed at a housing from electromagnetic interference generated during operation of the electronic device. Assembly of the apparatus which shields such component portions from one another is effectuated by lowering the component portions in a single in-line direction thereby to facilitate automated assembly.

20 Claims, 5 Drawing Sheets

APPARATUS, AND ASSOCIATED METHOD, FOR SHIELDING EMI-GENERATIVE COMPONENTS OF AN ELECTRICAL DEVICE

The present invention relates generally to a manner by which to isolate emi (electromagnetic interference)-generative devices to prevent emanation of electromagnetic interference which might interfere with operation of other devices. More particularly, the present invention relates to apparatus, and an associated method, by which to shield emi-generative component portions of an electronic device, such as the radio transceiver circuitry of a radio base station operable in a cellular, or other, radio communication system. An embodiment of the present convention provides emi shielding of component portions of the electronic device while also providing a manner by which the component portions can be electrically connected, simply and in an automated manner, without such connections causing leakage of electromagnetic interference.

BACKGROUND OF THE INVENTION

Advancements in electronics have permitted the introduction, and widespread usage, of devices which are operable at seemingly ever-increasing rates. Because of the increased rates of operation at which such devices are operated, the operations performed by such devices can be effectuated at corresponding increased rates. Operation of such devices at high frequencies of operation is generally advantageous as a greater number of operations can be performed by such devices within a given time period.

However, when an electronic device is operated at frequencies which correspond to radio frequencies, the mere operation of such devices causes the generation of radio frequency energy. The radio frequency energy forms electromagnetic interference (emi) which can emanate therefrom from the electronic device during its operation.

Devices which are operated at high clock frequencies, and those which utilize high-frequency clock circuits, are exemplary of devices which generate electromagnetic interference as a result of their high frequency of operation. Regulatory requirements have been set forth which require that the electromagnetic interference generated by such devices be attenuated so as not to cause interference with operation of other devices. Attenuation of the electromagnetic interference is effectuated, for instance, by housing the emi-generative, electronic device within a metallic enclosure. The metallic enclosure forms a shell which prevents the emanation of the electromagnetic interference beyond the enclosure shell. While a metallic housing adequately prevents the emanation of electromagnetic interference generated by a device positioned therewithin, electromagnetic interference generated by one portion of the device housed within the housing might also interfere with operation of another portion of that device.

To prevent the occurrence of such intra-device interference, separate portions of the single device can be isolated from other portions of the device. Housings of various configurations have been constructed to facilitate shielding of different portions of a single device from one another. Conventionally, emi shields, forming shield walls, are positioned between the different sections of the device to reduce intra-device interference. Typically, however, the separate portions of the device must be electrically connected together and the shield by which the portions of the device are shielded from one another must be configured in a manner to permit such electrical connections to be formed. Typically, holes are formed through the shield walls to permit the electrical connections to extend therethrough. Formation of the holes, however, degrade the performance of the shields. That is to say, the amount of isolation provided by the shields is reduced by the existence of holes which are formed therethrough. The need to form such holes is sometimes the limiting factor in the level of realizable isolation that the emi shields can provide.

An additional disadvantage associated with the conventional need to form holes in the emi shields to permit the formation of electrical connections between various portions of a device is that hand operations are required for the installation of mechanical connectors to form the electrical connections. Such hand operations are required, for instance, to form solder connections or to position the mechanical connectors due to mechanical tolerances. Electrical cables can alternatively be utilized in substitution for mechanical connectors. However, holes are still required to be formed through the emi shields and hand assembly operations are still typically required.

A radio transceiver, such as the circuitry of a radio base station, is exemplary of a device which generates electromagnetic interference during its operation. To prevent emanations of the electromagnetic interference away from the circuitry of the radio base station, the circuitry is typically housed within an appropriate enclosure. And, to prevent electromagnetic interference generated by one portion of the circuitry of the radio base station from interfering with operation of another portion of the circuitry, emi shields are positioned within the enclosure to isolate the one portion from another. For instance, the power amplifier section is isolated from the receiver. Electromagnetic interference generated by the power amplifier is thereby prevented from interfering with operation of the receiver. Degradation of the levels of isolation provided by the emi shields also results at a radio base station when holes are formed in shield walls to permit electrical connections to be formed between the different portions of the transceiver circuitry.

An improved manner by which to isolate emi-generative component portions of an electronic device, such as the transceiver circuitry of a radio base station, would advantageously improve the amount of isolation that such shields could provide. A manner which would better facilitate the electrical connection of the component portions of the electronic device while still providing for emi-shielding would also be advantageous.

It is in light of this background information related to emi-generative devices that the significant improvements of the present invention have evolved.

SUMMARY OF THE INVENTION

The present invention, accordingly, advantageously provides apparatus, and an associated method, by which to shield emi-generative component portions of an electrical device to prevent electromagnetic interference generated by one of the component portions from interfering with operation of other component portions of the device. Shielding is provided in a manner which also facilitates electrical connection of the component portions of the device together. The manner by which the electrical connection is provided permits the formation of the electrical connection in an automated manner, thereby to decrease the number of hand operations required of an operator to form such electrical connections.

In one aspect of the present invention, the emi shielding is provided in a manner which reduces levels of leakage of electromagnetic interference between separate isolation areas defined by the emi shield. While conventional manners by which to isolate separate emi-generative component portions of a device generally require that a hole be cut in a metallic enclosure between separate isolation areas to permit the fitting of mechanical connectors, or cable wires therethrough, an embodiment of the present invention obviates such a requirement.

Separate compartments are formed, and the separate component portions of the device are housed in the separate compartments. Electrical connection between the component portions is provided by way of a wired-connector extending through a duct defined beneath floor walls of the compartments. An isolation block, which in part, defines the configuration of the duct is seated between the separate compartments to facilitate the shielding between such compartments as well as defining the configuration of the duct. An up-standing shield wall is positioned between the separate compartments. As the electrical connection is made by way of a duct extending through the floor walls of the separate compartments rather than the shield wall separating the compartments, leakage of the electromagnetic interference between the two compartments is substantially reduced relative to conventional configuration of isolation apparatus.

In another aspect of the present invention, the configuration of the duct and the wired-connector extending therethrough facilitates automated assembly operations to electrically connect the component portions of the device. In a single in-line operation which can be performed by automated apparatus, the component portions are lowered into their respective compartments and also electrically connected to the wired-connector extending through the duct between the separate compartments. The conventional requirement of extensive hand operations to install the mechanical connectors or to position the component portions to permit their electrical connection theretogether is obviated.

In one implementation, apparatus is provided to shield separate portions of a radio base station to prevent electromagnetic interference generated by one portion of the radio base station circuitry from interfering with operation of other portions of the radio base station circuitry. For instance, a power amplifier, forming an element of the transmitter portion of the radio base station circuitry, is an emi-generative element. Emanation of electromagnetic interference generated as a by-product of operation of the power amplifier can cause interference which adversely affects operation of other component portions of the radio base station circuitry. Utilization of an embodiment of the present invention attenuates such electromagnetic interference so that the power amplifier-generated interference does not adversely affect operation of other portions, such as the receiver portion, of the radio base station circuitry. Assembly of the component portions of the radio base station is advantageously effectuated by an automated process. A first circuit board upon which a first circuit portion of the radio base station circuitry is embodied is lowered into position into a first compartment which forms an emi-isolation compartment. The operation of lowering the first circuit board into position also operates to electrically connect the first circuit board to a wired-conductor which extends through a duct forms to extend between the first compartment and a second compartment. A second circuit board is lowered into position into a second compartment which forms a second emi-isolation compartment. The operation of lowering the printed circuit board containing the second circuit portion of the radio base station circuitry also operates to electrically connect the second circuit board to the wired-conductor extending through the duct formed between the first and second compartments. Thereby, the first and second circuit boards and the circuit component portions embodied thereon are electrically connected by way of the wired-conductor but without the need for hand operations to effectuate the formation of the connections.

In another implementation, a chassis is formed for supporting the first and second component portions of the radio base station in supportive isolation from one another to prevent electromagnetic interference generated by one of the component portions from interfering with operation of another of the component portions while still permitting formation of an electrical connection therebetween. A chassis includes interior component in which an isolation block is seated. The isolation block has a shield wall extending thereabove which separates the interior compartment into a first compartment and a second compartment. The isolation block is seated in a manner to be separated from the floor walls of the interior compartment wherein the separation therebetween defines a duct extending between the first and second compartments formed thereby. A wired-conductor is positioned to extend through the duct so-formed. By lowering the first and second component portions of the radio base station circuitry into the first and second compartments respectively, such portions are shielded from one another but electrically connected by way of the wired-conductor extending therebetween.

In these and other aspects, therefore, apparatus, and an associated method, is provided for shielding a first component portion from a second component portion of an electronic device. A first compartment is formed to receive the first component portion therein. And, a second compartment is formed to receive a second component portion therein. An isolation block and an up-standing shield wall are positioned therebetween. The isolation block, when positioned, defines a duct through which a wired-conductor is permitted to extend to electrically connect the first and second component portions there together.

A more complete appreciation of the present invention and the scope thereof can be obtained from the accompanying drawings which are briefly summarized below, the following detailed description of the presently-preferred embodiments of the invention, and the appended claims.

DETAILED DESCRIPTION OF THE PREFERRED EMBODIMENT

Figure 1:
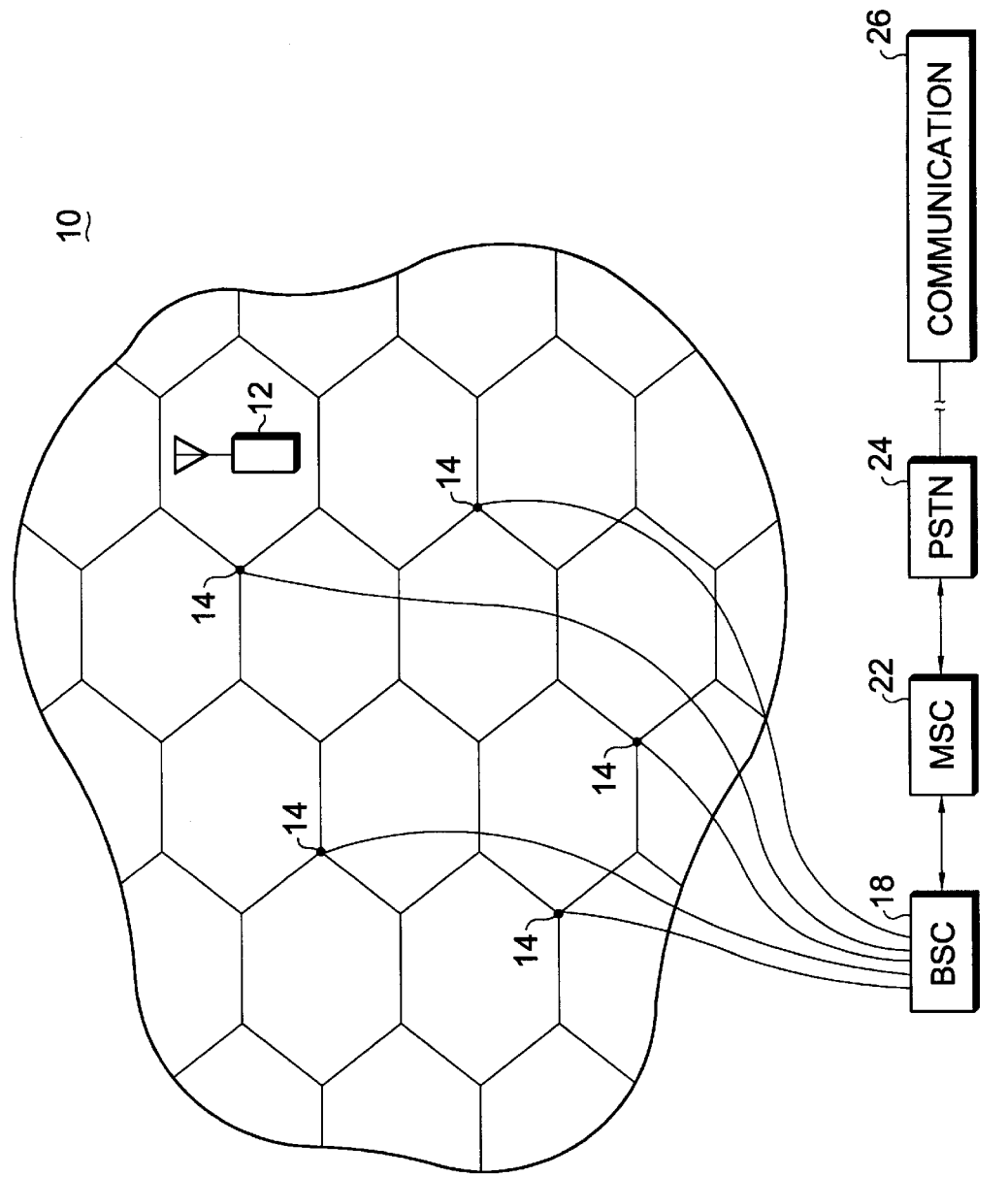
FIG. 1 illustrates a representation of a portion of a cellular communication system containing radio base stations at which an exemplary implementation of the present invention is embodied.

Turning first to FIG. 1, a portion of a cellular communication system, shown generally at 10, provides for wireless communications with mobile stations of which the mobile station 12 is exemplary. The system 10 includes a plurality of spaced-apart radio base stations 14 which are positioned throughout a geographical area. The Figure is exemplary, and, in a typical cellular communication system, a large number of radio base stations are positioned throughout the geographical area.

In the implementation shown in the Figure, sets of three radio base stations 14 are co-located. Each of the radio base stations defines a cell 16. A cell is a portion of the geographical area encompassed by the cellular communication system within which communications between a mobile station and a radio base station which defines such cell.

In the exemplary illustration in which sets of three base stations 14 are co-located, each radio base station defines a sector cell in conventional manner. Groups of the radio base stations 14 are coupled to a BSC (base station controller) 18. A BSC is operable to control operation of the radio base stations coupled thereto. Groups of BSCs are coupled to an MSC (mobile switching center) 22. An MSC is operable, amongst other things, to perform switching operations. The MSC is coupled to a PSTN (public-switched telephonic network) 24. And, the PSTN is coupled to communication stations, such as the communication station 26.

In an exemplary implementation, an embodiment of the present invention is utilized at the radio base stations 14 to provide emi-shielding at the radio base stations. While the following detailed description shall be described with respect to such an implementation, it should be understood that in other embodiments, the teachings of the present invention can analogously be utilized together with other apparatus including other portions of the cellular communication system 10 as well as in conjunction with many other types of apparatus which generates electromagnetic interference.

Figure 2:
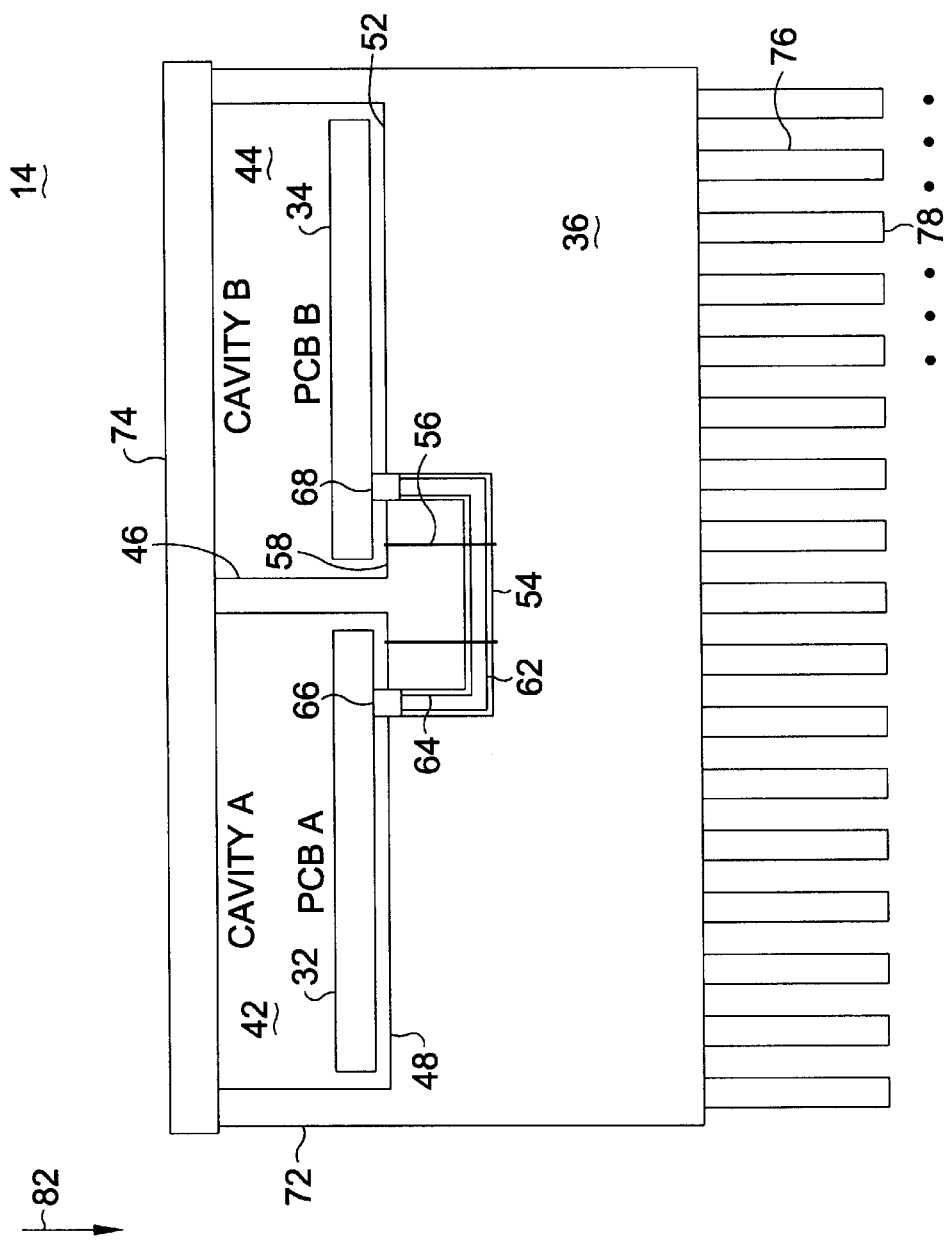
FIG. 2 illustrates a functional, cut-away, side-elevational view of an exemplary embodiment of the present invention.

Turning then to FIG. 2, a portion of a radio base station 14 which includes an embodiment of the apparatus of the present invention is shown. A first component portion 32 of the radio base station circuitry is embodied upon a first circuit board, and a second component portion 34 of the radio base station circuitry is embodied upon a second circuit board. The component portions 32 and 34 are supported at a main chassis housing 36.

The main chassis housing includes an internal chamber divided into a first compartment 42 and a second compartment 44 separated by a shielding wall 46. The first component portion 32 is positioned above a floor wall 48 of the first component 42, and the second component portion 34 is positioned above a floor wall 52 of the second compartment 44.

A depression 54 beneath the floor walls 48 and 52 provides a port for receiving an isolation block 56 therein. The shielding wall 56 is affixed to the isolation block 56 and extends upwardly beyond a top face surface 58 of the shielding wall. The isolation block 56 is maintained at a separation distance from the main chassis housing 36, thereby to define a duct, here a U-shaped duct 62 extending between the first compartment 42 and the second compartment 44. A wired-conductor 64 is positioned to extend through the duct 62. A first-end 66 of the wired-conductor 64 is electrically connected to the first component portion 32 of the radio station circuitry. And, a second-end 68 of the wired-conductor 64 is connected to the second component portion 34 of the radio base station circuitry when the component portion is positioned, as shown, within the second compartment 44.

The main chassis housing 36 further includes an upstanding outer perimetal wall 72 which defines outer walls of the first and second compartments 42 and 44 respectively. A lid 74 is positioned to cover the compartments 42 and 44, thereby to form emi-isolation compartments which prevent the emanation of electromagnetic interference generated by the circuitry of the first and second component portions 32 and 34 from the respective compartments 42 and 44 in which such portions are positioned. The main chassis housing 36 further includes a heat sink 76, here formed of a plurality of fin members 78. In conventional manner, the heat sink 76 facilitates the dissipation of thermal energy generated during operation of the circuitry of the radio base station housed within the main chassis housing.

Assembly of the portions of the radio base station 14 shown in the Figure is advantageously effectuated with the use of automated apparatus. Each of the illustrated elements is positioned by lowering such element in a single direction, indicated by the arrow 82. That is to say, by merely lowering such elements into position, in an in-line direction represented by the arrow 82, assembly is effectuated. Such single-direction assembly is quickly, and efficiently, carried out by automated apparatus.

For instance, assembly apparatus (not shown) is advantageously utilized, first to position the wired-conductor 64 at the depression 54. Then, the isolation block 56, together with the shielding wall 46, is lowered into position at the depression 54. Thereafter, the first and second component portions 32 and 34 are lowered into position upon the respective floor walls 48 and 52. By positioning the component portions in position above the respective floor walls, the component portions become electrically connected to the opposing ends 66 and 68 of the wired-conductor. Thereafter, the lid 74 is lowered into position, thereby to wholly enclose the component portions into their respective compartments.

Because no through holes are required to be formed through the shielding wall 46 to permit the formation of electrical connections between the component portions 32 and 34, leakage of electromagnetic interference between the compartments 42 and 44 is reduced. Electromagnetic interference generated during operation of the circuitry of one of the component portions is thereby less likely to interfere with operation of the circuitry of another component portion of the radio base station circuitry. For instance, if the power amplifier of the transmitter portion of the radio base station circuitry forms part of the first component portion 32, generation of electromagnetic interference during operation of the power amplifier is attenuated and does not interfere with operation of the circuitry of the second component portion, which, for example, might form the receiver portion of the radio base station circuitry.

Figure 3:
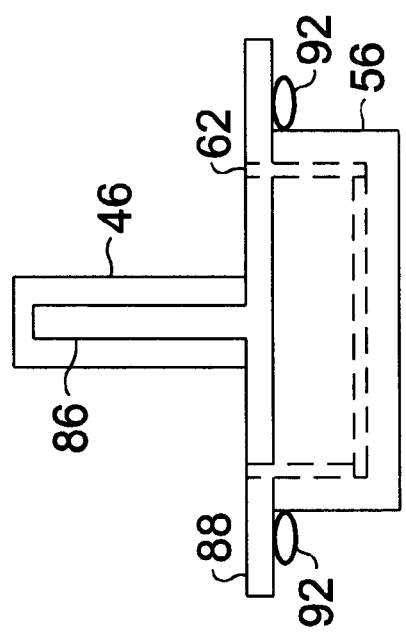
FIG. 3 illustrates an isolational, side-elevational view of a portion of the apparatus shown in FIG. 2.

FIG. 3 illustrates the isolation block 56 together with the wall 46 of an embodiment of the present invention. Here, the duct 62 is bored through the body of the isolation block to prevent a wired-conductor to extend therethrough. The wired-conductor can, for instance, be positioned to extend through the duct 62 in a pre-assembly procedure.

The shielding wall 46 is here shown further to include a longitudinally extending groove 86 which facilitates slotted engagement with a corresponding slot (not shown in the Figures) formed along an appropriate portion of the perimetal wall 72 (shown in FIG. 1).

In the embodiment illustrated in FIG. 3, the isolation block further includes a top lip portion 88 at which an emi-absorptive gasket 92 is affixed. When the isolation block is lowered into position at the main chassis housing 36

(shown in FIG. 2), the gasket 92 affixed to the lipped portion 88 seats upon the floor walls 48 and 52 of the housing. Thereby, electromagnetic interference generated during operation of one of the component portions is attenuated and is not permitted to cause interference with operation of circuitry positioned at another of the compartments.

Figure 4:
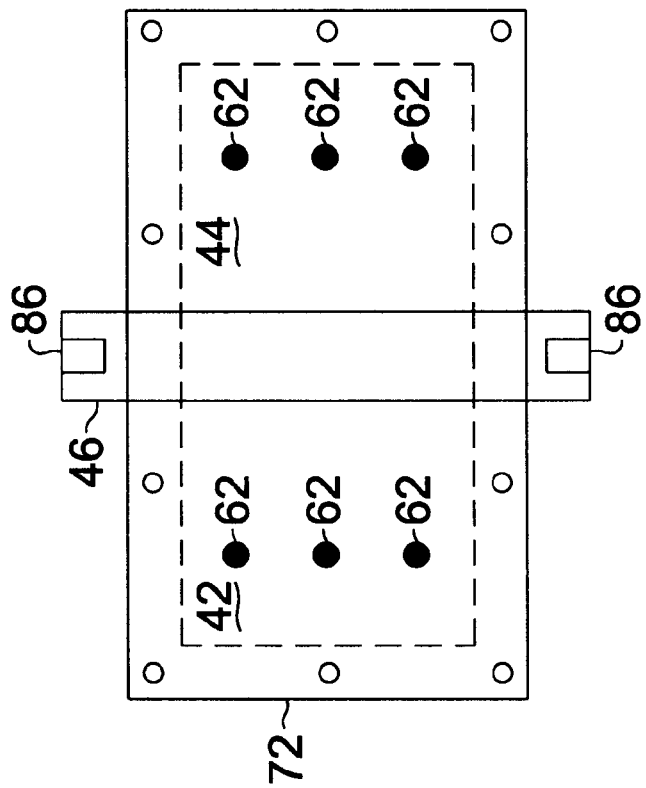
FIG. 4 illustrates an overhead view of the apparatus shown in FIG. 2.

FIG. 4 illustrates an embodiment in which a plurality of ducts 62 are positioned to extend between the compartments 42 and 44. The perimetal wall 72 extending about the outer perimeter of the main chassis housing is further outlined in the Figure. And, the shielding wall 46, together with the grooves 86 and end surfaces thereof, are also shown in the Figure.

Figure 5:
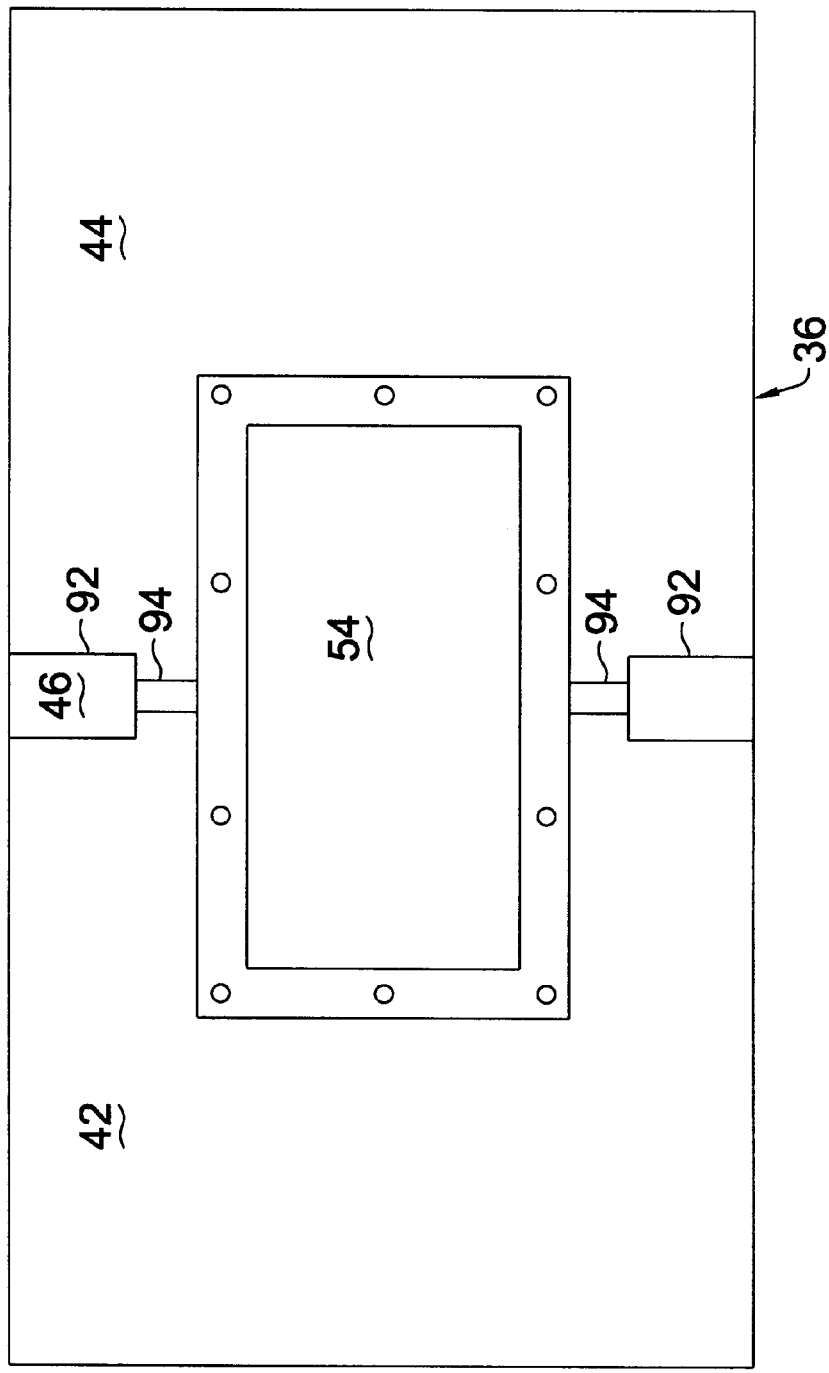
FIG. 5 illustrates an overhead view of a portion of the apparatus shown in FIG. 2.

FIG. 5 also illustrates the main chassis housing 36, here again showing the first and second compartments 42 and 44 whereat component portions of the radio base station circuitry can be positioned. In the view of FIG. 5, the depression 54, formed to permit isolation of the isolation block (shown in FIGS. 2 and 3) is illustrated. And, slotted walls 92, each containing longitudinally extending slot members 94 are also shown. Such slotted wall members engage with the shielding wall 46 (shown in FIGS. 2 and 3) to isolate the components 42 and 44 from each other.

Figure 6:
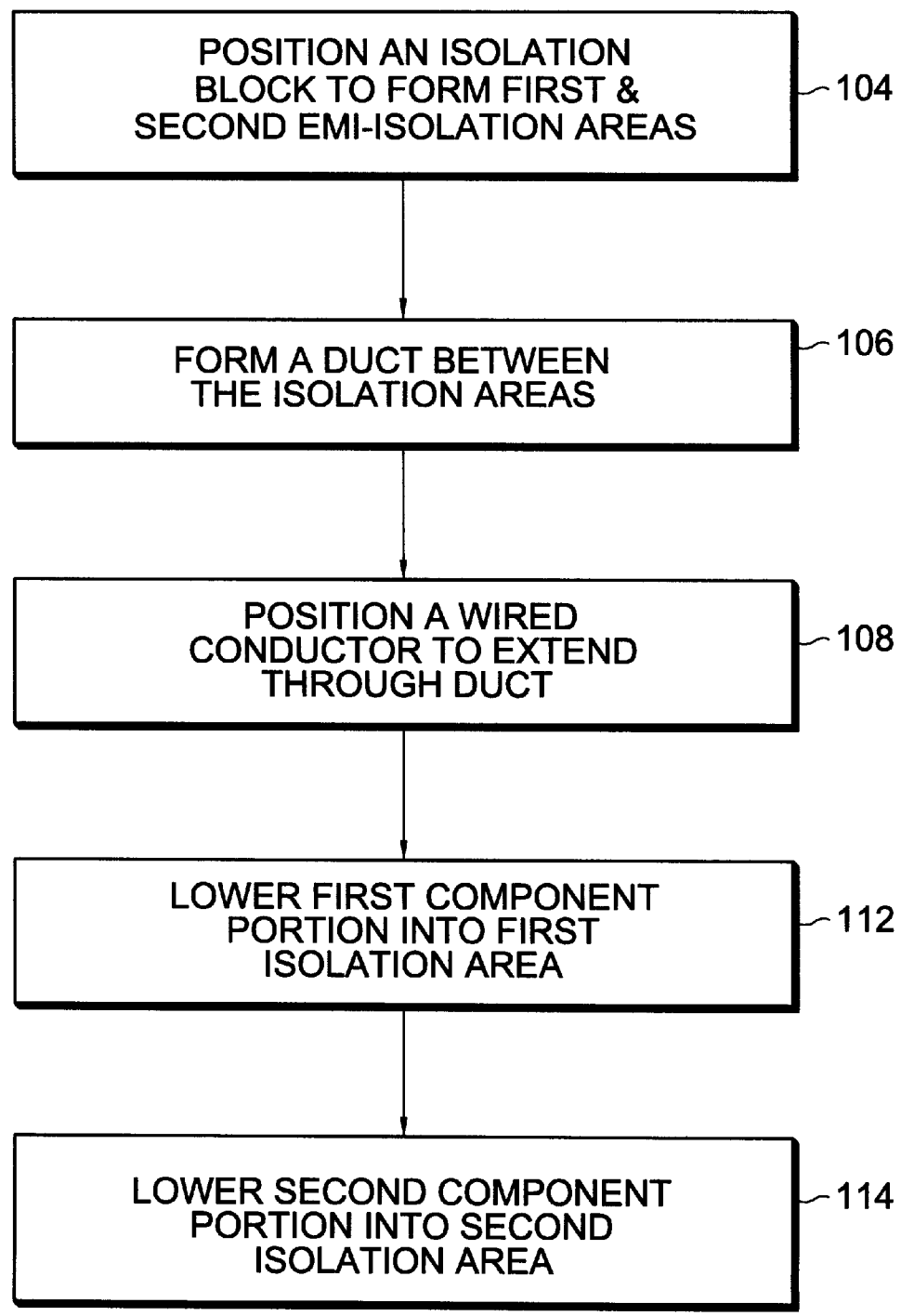
FIG. 6 illustrates a method flow diagram listing the method steps of the method of operation of an embodiment of the present invention.

FIG. 6 illustrates a method, shown generally at 102, of an embodiment of the present invention. The method 102 shields a first component of an emi-generative device from a second component portion of the device while permitting formation of an electrical connection therebetween.

First, and as indicated by the block 104, an isolation block is positioned between a first component forming a first emi-isolation area, and the second compartment forming a second emi-isolation area. Then, and as indicated by the block 106, a duct is formed, defined between the isolation block and the first and second compartments.

Then, and as indicated by the block 108, a wired-conductor is positioned to extend through the duct between the first and second compartments. The wired-conductor has a first side portion positioned at the first compartment and a second side portion positioned at the second compartment.

Then, and as indicated by the block 112, the first component portion is lowered into the first compartment to position the first component portion at the first compartment and also to connect the first component portion to the first side portion of the wired-conductor.

Then, and as indicated by the block 114, the second component portion is lowered into the second compartment to position the second component portion at the second compartment and also to connect the second component portion to the second side portion of the wired-conductor.

Thereby, a manner is provided by which to isolate emi-generative portions of an electronic device. Assembly is also permitted by way of automated apparatus as the assembly is effectuated by an in-line technique.

The previous descriptions are of preferred examples for implementing the invention, and the scope of the invention should not necessarily be limited by this description. The scope of the present invention is defined by the following claims.

We claim:

1. In an assembly having an emi (electromagnetic interference) generative device, the emi-generative device having a first component portion and at least a second component portion, an improvement of apparatus for shielding the first component portion from the second component portion while permitting formation of an electrical connection therebetween, said apparatus comprising:

a first compartment having at least a first floor wall, the first component portion positioned above the first floor wall, said first compartment for forming a first emi-isolation area;

a second compartment having at least a second floor wall, the second component portion positioned above the second floor wall, said second compartment for forming a second emi-isolation area;

an isolation block positioned between the first floor wall of said first compartment and the second floor wall of said second compartment;

a duct defined between said isolation block and the first and second floor walls, respectively, and extending between said first compartment and said second compartment, said duct forming a conduit to permit the formation of the electrical connection between the first component portion and the second component portion.

2. The apparatus of claim 1 further comprising an upwardly-extending shield wall extending upwardly beyond a top face surface of said isolation block, said shield wall separating said first compartment and said second compartment.

3. The apparatus of claim 1 further comprising a first lid member positioned above the first component portion, said first lid member for enclosing said first compartment.

4. The apparatus of claim 3 further comprising a second lid member positioned above said second component portion, said second lid member for enclosing said second compartment.

5. The apparatus of claim 4 wherein said first lid member and said second lid member are integrally formed.

6. The apparatus of claim 1 wherein said isolation block further defines a bottom face surface, a first side wall, and a second side wall, the bottom face surface positioned beneath the first floor wall and the second floor wall of said first compartment and said second compartment.

7. The apparatus of claim 6 wherein said duct defined between said isolation block and said first and second floor walls is U-shaped, defined by said first and second side walls and said bottom face surface of said isolation block.

8. The apparatus of claim 7 wherein said duct includes a first upwardly-extending U-leg extending to said first compartment and a second upwardly-extending U-leg extending to said second compartment.

9. The apparatus of claim 1 wherein the emi-generative device is housed within a chassis housing and wherein the first floor wall and the second floor wall of said first compartment and said second compartment, respectively, are formed of surfaces of the chassis housing.

10. The apparatus of claim 9 wherein the first floor wall and the second floor wall defined by the surfaces of said chassis housing are separated by an isolation block indentation, said isolation block indentation for receiving said isolation block thereat.

11. The apparatus of claim 10 wherein the electrical connection permitted to be formed between the first component portion and the second component portion is permitted by way of a wired-conductor and wherein said wired conductor is permitted to extend through said duct defined between said isolation block, received at said isolation-block indentation, and the first and second floor walls.

12. The apparatus of claim 10 wherein said isolation block further comprises a lipped portion positioned thereabout, said lipped portion for seating upon the first floor wall and upon the second floor wall of said first compartment and said second compartment, respectively.

13. The apparatus of claim 12 further comprising a gasket member positioned at the lipped portion, said gasket member for forming a seal between said isolation block and the first and second floor walls, respectively, when said isolation block is positioned at said isolation block depression.

14. The apparatus of claim 11 wherein the first component portion comprises an electrical circuit board having a connector member affixed thereto, said connector member connectable to said wired-conductor by positioning the first component portion in a single-direction movement into position at said first compartment.

15. The apparatus of claim 11 wherein the second component portion comprises an electrical circuit board having a connector member affixed thereto, said connector member connectable to said wired-conductor by positioning the second component portion in a single-direction movement into position at said second compartment.

16. A method for shielding a first component portion of an emi-generative (electromagnetic interference-generative) device from a second component portion of the emi-device while permitting formation of an electrical connection therebetween, said method comprising:

- positioning an isolation block between a first compartment forming a first emi-isolation area and a second compartment forming a second emi-isolation area;
- forming a duct defined between the isolation block and the first and second compartments, respectively;
- positioning a wired-conductor to extend through the duct between the first and second compartments, the wired-conductor having a first side portion positioned at the first compartment and a second side portion positioned at the second compartment;
- lowering the first component portion into the first compartment to position the first component portion at the first compartment and also to connect the first component portion to the first side portion of the wired-conductor; and
- lowering the second component portion into the second compartment to position the second component portion at the second compartment and also to connect the second component portion to the second side portion of the wired-conductor.

17. The method of claim 16 wherein said operation of lowering the first component portion comprises a single-direction movement both to position the first component portion at the first compartment and to connect the first component portion with the wired-conductor.

18. The method of claim 16 wherein said operation of lowering the second component portion comprises a single-direction movement both to position the second component portion at the second compartment and to connect the second component portion with the wired-connector.

19. The method of claim 16 wherein said operation of forming the duct is performed concurrent with, and as a result of, performance of said operation of positioning the isolation block between the first and second compartments, respectively.

20. In a radio base station having a first emi-generative portion and a second emi-generative portion, an improvement of a chassis for shielding the first emi-generative portion from the second emi-generative portion while permitting formation of an electrical connection therebetween, said chassis comprising:

- a first compartment having at least a first floor wall, the first emi-generative portion positioned above the first floor wall, said first compartment for forming a first emi-isolation area;
- a second compartment having at least a second floor wall, the second emi-generative portion positioned above the second floor wall, said second compartment for forming a second emi-isolation area;
- an isolation block positioned between the first floor wall of said first compartment and the second floor wall of said second compartment; and
- a duct defined between said isolation block and the first and second floor walls, respectively and extending between said first compartment and said second compartment, said duct forming a conduit to permit the formation of the electrical connection between the first emi-generative portion and the second emi-generative portions.

* * * * *